US010278310B2

(12) United States Patent
Koga

(10) Patent No.: US 10,278,310 B2
(45) Date of Patent: Apr. 30, 2019

(54) ASSISTANCE APPARATUS, ASSISTANCE METHOD, AND PROGRAM

(71) Applicant: Azbil Corporation, Chiyoda-ku (JP)

(72) Inventor: Kei Koga, Chiyoda-ku (JP)

(73) Assignee: AZBIL CORPORATION, Chiyoda-ku (JP)

( * ) Notice: Subject to any disclaimer, the term of this patent is extended or adjusted under 35 U.S.C. 154(b) by 15 days.

(21) Appl. No.: 15/469,815

(22) Filed: Mar. 27, 2017

(65) Prior Publication Data

US 2017/0290200 A1 Oct. 5, 2017

(30) Foreign Application Priority Data

Mar. 31, 2016 (JP) .................................. 2016-070195

(51) Int. Cl.
*H05K 7/20* (2006.01)

(52) U.S. Cl.
CPC ..... *H05K 7/20745* (2013.01); *H05K 7/20836* (2013.01); *H05K 7/207* (2013.01); *H05K 7/2059* (2013.01); *H05K 7/20536* (2013.01)

(58) Field of Classification Search
CPC .......... H05K 7/20745; H05K 7/20836; H05K 7/207; H05K 7/2059; H05K 7/20536
See application file for complete search history.

(56) References Cited

U.S. PATENT DOCUMENTS

| 7,313,461 | B2* | 12/2007 | Sharma | G05D 1/0282 318/567 |
| 7,878,008 | B1* | 2/2011 | Mateski | G01W 1/02 62/125 |
| 2005/0024826 | A1* | 2/2005 | Bash | G06F 1/20 361/695 |
| 2005/0267639 | A1* | 12/2005 | Sharma | G05D 23/1931 700/276 |

FOREIGN PATENT DOCUMENTS

| JP | 2012-063049 A | 3/2012 |
| JP | 2014-016223 A | 1/2014 |

* cited by examiner

*Primary Examiner* — Mischita L Henson
(74) *Attorney, Agent, or Firm* — Oblon, McClelland, Maier & Neustadt, L.L.P.

(57) ABSTRACT

An assistance apparatus according to the disclosure generates monitor area data on the basis of dimension data of rack rows that are each constituted by a plurality of racks and that are arranged in a first direction in a three-dimensional space, the dimension data including the length of each rack row in the first direction and the height thereof in a second direction perpendicular to the first direction, interval data that includes an interval, in a third direction, between the rack rows adjacent to each other in the third direction, the third direction being perpendicular to the first and second directions, field-of-view angle data that includes the field-of-view angle of each temperature sensor, and temperature sensor position data that indicates certain temperature sensor positions; and includes a display control unit that displays monitor coverage information on a display device on the basis of the monitor area data.

10 Claims, 15 Drawing Sheets

ASSISTANCE APPARATUS, ASSISTANCE METHOD, AND PROGRAM

CROSS-REFERENCE TO RELATED APPLICATIONS

The present application claims priority to Japanese Application No. 2016-070195, filed Mar. 31, 2016, the entire contents of which are incorporated herein by reference.

1. FIELD

The present disclosure relates to an assistance apparatus, an assistance method, and a program for assisting placement of non-contact-type temperature sensors in a temperature monitoring system for monitoring the surface temperatures of racks that store information and communication technology (ICT) devices in a facility, such as a data center, by using the non-contact-type temperature sensors.

2. DESCRIPTION OF THE RELATED ART

In a facility, such as a data center or a server room, in which servers or other ICT devices are placed, the temperature of a space in which the ICT devices are housed is controlled by an air conditioning system to enable the ICT devices to securely operate.

For example, in an air conditioning system for data centers in which racks that store ICT devices are arranged in a plurality of rows, the spaces (aisles) between the rack rows are separated into aisles (hot aisles) to which air from the ICT devices is exhausted and aisles (cold aisles) through which cold air from, for example, the floor and the ceiling is supplied, and air-conditioning control is separately performed to thereby maintain the temperature of the space in which the rack rows are placed to a predetermined value (see Japanese Unexamined Patent Application Publication No. 2012-63049).

Meanwhile, for an office space, for example, a technique is being developed in which non-contact-type temperature sensors, such as thermopile array sensors, are used to perform lighting control in accordance with detection of the presence or absence of a person or perform air-conditioning control by taking into consideration the temperature distribution (see Japanese Unexamined Patent Application Publication No. 2014-16223).

In most of the data centers described above, contact-type temperature sensors are placed at multiple points for detecting and monitoring the cooling state, for example, of the ICT devices. However, with contact-type temperature sensors, the temperatures of only the placement points can be measured, and detailed temperature detection and monitoring are difficult. Therefore, area-wide temperature measurement using non-contact-type temperature sensors, such as thermopile array sensors, is desirable.

In general, in an office, the above-described non-contact-type temperature sensors are often placed on the ceiling and oriented so as to perpendicularly observe the floor. Here, the height from the floor to the ceiling is usually constant, and therefore, a monitor area that can be monitored by each of the temperature sensors is constant.

Accordingly, the placement position of each of the temperature sensors in the horizontal direction needs to be determined such that, for example, the monitor area includes an area that is desired to be monitored.

However, in a case of a data center in which racks face each other and sensors are placed on the top of the racks, for example, the width of an area that can be monitored changes depending on the distance between racks. In this case, if a large number of racks are present, and the distance between racks is not constant or the distance between racks is not finalized, it is necessary to make a sensor placement plan under the assumption that there are different distances between racks. That is, the placement position of each sensor with which an area that is desired to be monitored is included in an area that can be monitored changes depending on the distance between the racks of interest. Here, if a method is used in which each sensor is actually placed, the monitor area is checked by checking the thermal image, and the placement position is determined accordingly, a high operation cost is incurred. Even if an area that can be monitored is determined by calculation, in the case where there are different distances between racks, a calculation error is highly likely to occur. A case is assumed where the distance between racks is not finalized (the rack arrangement and the sensor arrangement are simultaneously planned, for example) and three rack rows, for example, are arranged side by side. If the middle rack row is arranged slightly to the right, the distance between the rack rows on the right becomes smaller and the distance between the rack rows on the left becomes larger accordingly. Such a change in the arrangement, for example, is likely to be overlooked, or a calculation error is likely to occur from such a change, resulting in re-placement, ordering of surplus sensors, additional ordering for shortages, and so on, which may cause inefficiencies.

As described above, when a temperature monitoring system using non-contact-type temperature sensors is implemented in a data center, an operation for procuring temperature sensors in a case of system introduction or a layout change is likely to cause inefficiencies, and the present inventors think that improvement is needed.

SUMMARY

The disclosure is made in view of the above-described issues, and an object thereof is to reduce inefficiencies in a sensor procurement operation that is performed in a case of introduction of a temperature monitoring system using non-contact-type temperature sensors or in a case of a layout change.

An assistance apparatus (1) according to an aspect of the disclosure is an assistance apparatus for assisting placement of non-contact-type temperature sensors (6) in a temperature monitoring system (100) for monitoring surface temperatures of racks (50) that store ICT devices by using the temperature sensors, the assistance apparatus including: a monitor area data generation unit (17) and a display control unit (15). The monitor area data generation unit generates monitor area data (145) of the temperature sensors in a three-dimensional space (30) in which the racks are arranged, on the basis of: dimension data (141) of rack rows (5) that are each constituted by a plurality of racks among the racks and that are arranged in a first direction (Y) in the three-dimensional space, the dimension data including a length (L) of each of the rack rows in the first direction and a height (h) of each of the rack rows in a second direction (Z) perpendicular to the first direction in the three-dimensional space; interval data (143) that includes an interval (d), in a third direction (X), between the rack rows that are adjacent to each other in the third direction, the third direction being perpendicular to the first direction and the second direction in the three-dimensional space; field-of-view angle data (142) that includes a field-of-view angle ($\phi$)

of each of the temperature sensors; and temperature sensor position data (144) that indicates certain temperature sensor positions. The display control unit displays monitor coverage information on a display device (16) on the basis of the monitor area data.

The assistance apparatus described above may further include: an operation input unit (11) that is used to externally input an operation; and an interval data generation unit (12) that generates the interval data. The display control unit may display rack row images (45) that represent the rack rows on the display device in accordance with the operation input via the operation input unit. The interval data generation unit may generate the interval data on the basis of a distance between the rack row images that are displayed on the display device and that are adjacent to each other in the third direction.

The assistance apparatus described above may further include: a temperature sensor position data generation unit (13) that generates, on the basis of the dimension data, the interval data, and the monitor area data, recommended temperature sensor position data that indicates a temperature sensor placement position with which a monitor-target rack row among the rack rows is included in a monitor area. The display control unit may display a temperature sensor image (46) that represents the temperature sensor placement position on the display device as monitor coverage information together with the rack row images.

In the assistance apparatus described above, the display control unit displays information about the monitor areas (61) of the temperature sensors on the display device. As the method for displaying information about the monitor areas (61), a method in which the color of portions of the rack row images corresponding to the monitor areas is changed, lines are displayed, or graphics are displayed, for example, can be used.

In the assistance apparatus described above, the monitor area data generation unit may update, in a case where the interval data is changed, the monitor area data on the basis of the changed interval data, and the display control unit may refresh display of the monitor coverage information when the monitor area data is updated.

In the assistance apparatus described above, the monitor area data generation unit may update, in a case where the dimension data is changed, the monitor area data on the basis of the changed dimension data, and the display control unit may refresh display of the monitor coverage information when the monitor area data is updated.

In the assistance apparatus described above, the temperature sensor position data generation unit may generate the temperature sensor position data by calculating a field-of-view width (W) on the basis of the height of a monitor-target rack row among the rack rows, the interval, and the field-of-view angle, and by calculating the number (n) of the temperature sensors that are necessary to monitor a surface temperature of the monitor-target rack row and calculating positions of the necessary temperature sensors in the first direction relative to the monitor-target rack row on the basis of the field-of-view width and the length of the monitor-target rack row.

Note that, in the above description, each constituent element of the disclosure is given a corresponding reference numeral, which is indicated in the drawings, in parentheses, for example.

According to the above description, with the disclosure, it is possible to check a change in the area that can be monitored, the change taking place in accordance with the interval between rack rows, to thereby prevent such a change from being overlooked and a calculation error from occurring. As a result, an operation for procuring temperature sensors in a case of introduction of a temperature monitoring system or in a case of a layout change of a server room to which a temperature monitoring system has been introduced can be made efficient, and the system introduction cost can be reduced.

DESCRIPTION OF THE PREFERRED EMBODIMENTS

Figure 1:
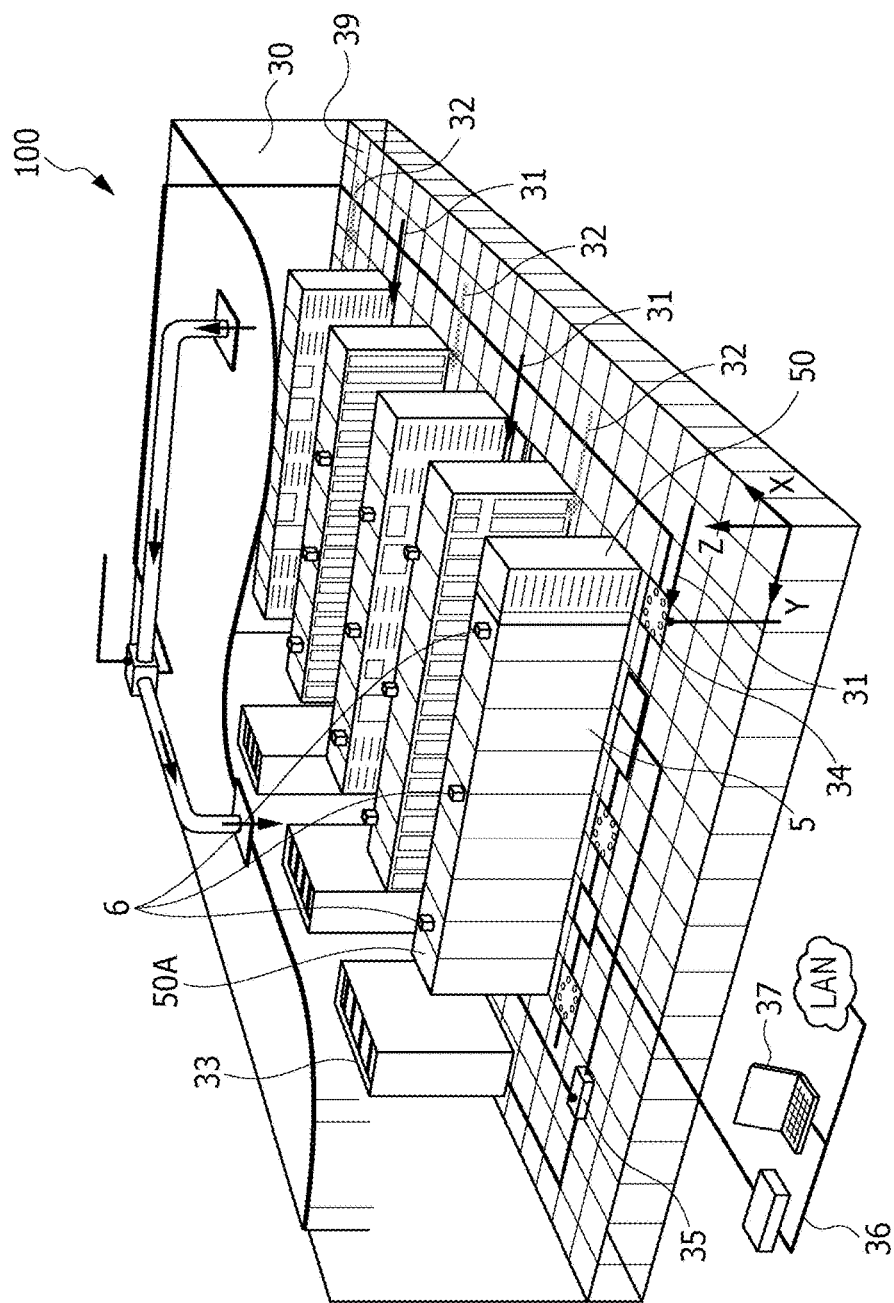
FIG. 1 is a perspective view illustrating a configuration of a temperature monitoring system that is an assistance target of an assistance apparatus according to an embodiment of the disclosure.

Hereinafter, embodiments of the disclosure will be described with reference to the drawings. In the following description, constituent elements common to the embodiments are assigned the same reference numerals, and duplicated description thereof is omitted.

Temperature Monitoring System

Figure 2:
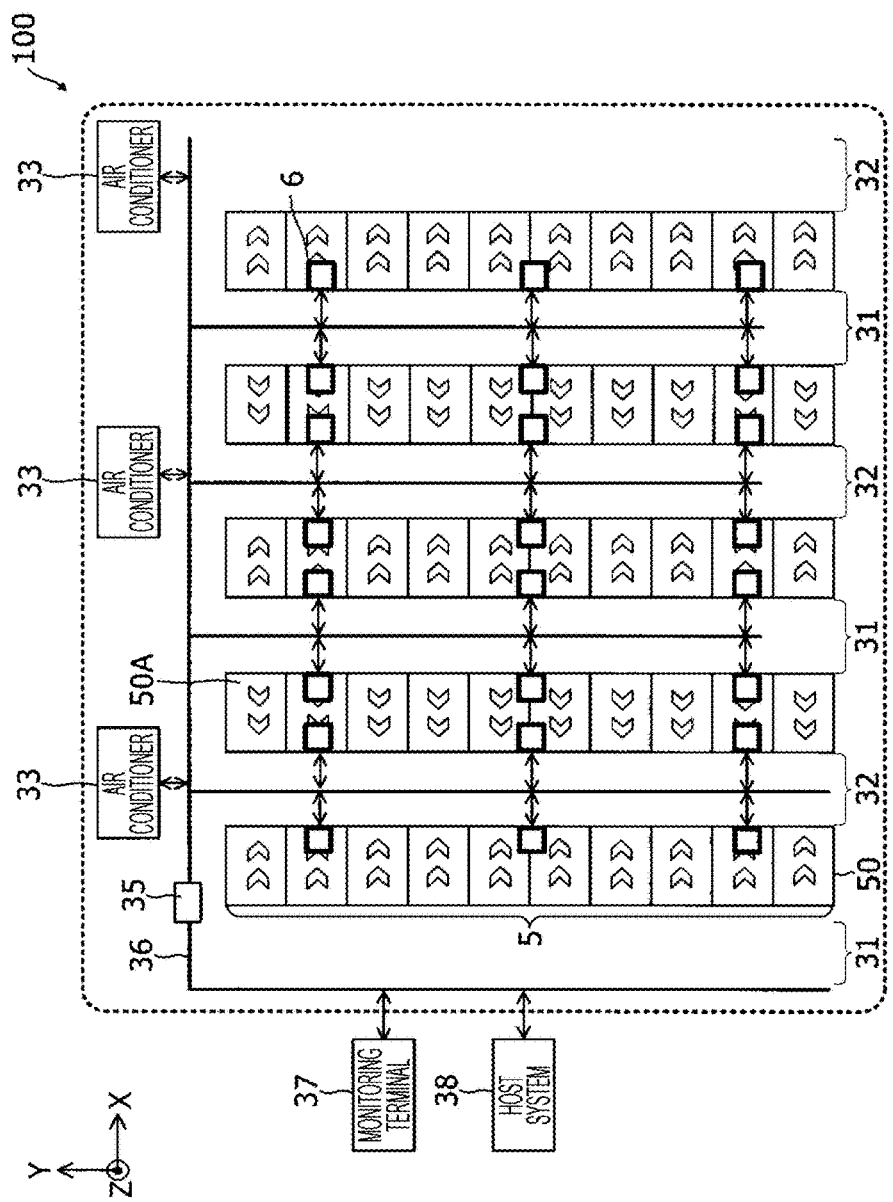
FIG. 2 is a plan view illustrating the configuration of the temperature monitoring system, which is an assistance target of the assistance apparatus according to an embodiment of the disclosure.

FIG. 1 is a perspective view illustrating a configuration of a temperature monitoring system 100, which is an assistance target of an assistance apparatus according to an embodiment of the disclosure. FIG. 2 is a plan view illustrating the configuration of the temperature monitoring system 100.

The temperature monitoring system 100 illustrated in FIG. 1 is a system for monitoring the surface temperatures of racks that store ICT devices in a data center or a server room, for example, by using non-contact-type temperature sensors. The assistance apparatus according to an embodiment of the disclosure is an apparatus for assisting placement of the non-contact-type temperature sensors, which are used in the temperature monitoring system 100.

First, the temperature monitoring system 100 is described.

The temperature monitoring system 100 illustrated in FIGS. 1 and 2 is used to monitor the surface temperatures of racks 50 that are arranged in a predetermined three-dimensional space 30, such as a data center or a server room.

Here, the surface temperature of each of the racks 50 includes not only the temperature of the surface of the rack 50 but also the surface temperatures of the ICT devices and other devices stored in the rack 50.

Each of the racks 50 is a framework for storing ICT devices (not illustrated). Examples of the rack 50 include a 19-inch rack. A plurality of the racks 50 are arranged in a Y-axis direction (first direction) in the three-dimensional space 30 to form one rack row 5. For example, FIGS. 1 and 2 illustrate a case where five rack rows 5 each formed of ten racks 50 are arranged in an X-axis direction (third direction) at predetermined intervals in the three-dimensional space 30.

In the three-dimensional space 30 (hereinafter sometimes simply referred to as "space 30"), at least one air conditioner 33 is arranged to perform control so as to maintain the temperature of the space 30 to a predetermined value. Specifically, as illustrated in FIGS. 1 and 2, the aisles between the rack rows 5 adjacent to each other in the X-axis direction are separated into hot aisles 32 to which air from the ICT devices is exhausted and cold aisles 31 through which cold air from a cooling fan 34 placed on the floor 39 (or on the ceiling, for example) is supplied, and air conditioning control is separately performed to maintain the temperature of the space 30 to a predetermined value. In FIG. 2, the mark added to each of the racks 50 indicates the direction of air that flows through the rack 50 (ICT devices).

On the upper surface 50A of each of the rack rows 5, that is, on a surface of each of the rack rows 5 opposite, in a Z-axis direction (second direction), to a surface thereof that is in contact with the floor 39, temperature sensors 6 are placed. As illustrated in FIG. 2, the temperature sensors 6 are connected to one another via, for example, a sensor hub 35. Data (thermal image data, for example) indicating the surface temperatures of the rack rows 5 detected by the temperature sensors 6 is transmitted to a monitoring terminal 37, such as a personal computer, or to a host system 38, for example, via a communication line 36, such as a local area network (LAN).

The monitoring terminal 37 displays, on the basis of the received data, thermal images or other images of the rack rows 5 and so on, on a display device, such as a liquid crystal display (LCD). A user can use the monitoring terminal 37 to know the surface temperature distribution of the rack rows 5 and so on and to recognize the state of cooling by air conditioning, hot spots, and the occurrence of abnormal heat generation, for example.

Now, the temperature sensors 6 are described in detail below.

Each of the temperature sensors 6 is a non-contact-type sensor that measures the surface temperature of an object in two dimensions. In this embodiment, an example case where each of the temperature sensors 6 is a thermopile array sensor is described.

Figure 3:
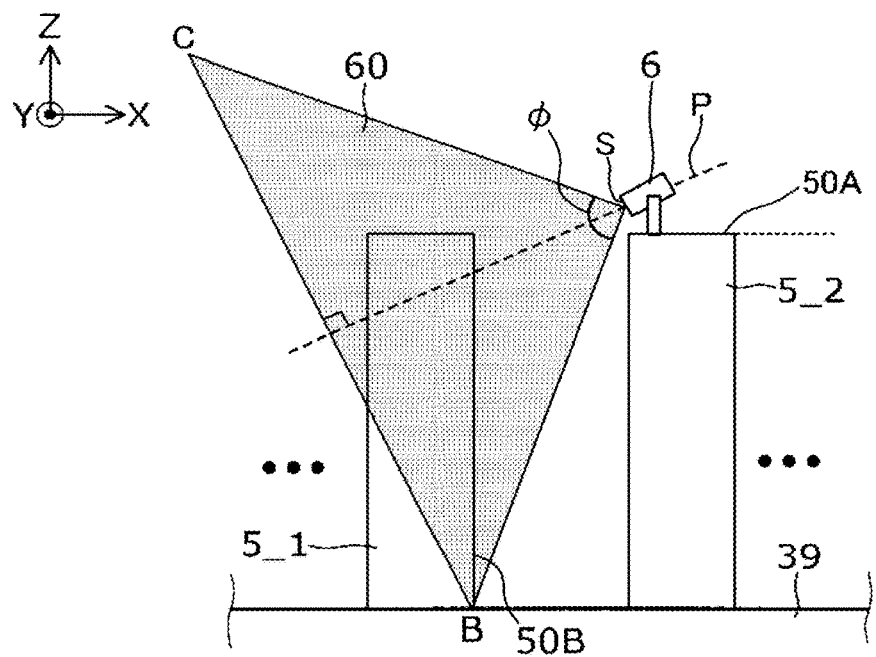
FIG. 3 is a diagram illustrating an example arrangement of a temperature sensor.

Further, in this embodiment, as an example condition on the sensor placement position, it is assumed that one or more temperature sensors 6 are placed on the upper surface 50A of the rack row 5 that is adjacent to the rack row 5 that is a monitor target in the X-axis direction. Specifically, as illustrated in FIG. 3, it is assumed that the temperature sensor 6 is placed on the upper surface 50A of a rack row 5_2, which is adjacent to a rack row 5_1, which is a monitor target, in the X-axis direction such that the temperature detection surface S of the temperature sensor 6 is oriented so as to face the monitor-target surface 50B of the rack row 5_1. Here, the temperature detection surface S is a sensor surface of the temperature sensor with which temperatures can be detected and, in a case of a thermopile array sensor, for example, is a surface on which a plurality of thermocouples inside a light receiving element are arranged in two dimensions.

In FIG. 3, the reference character φ represents the field-of-view angle of the temperature sensor 6, and the value of the field-of-view angle is specified in the specification or other documents of the temperature sensor, which is a thermopile array sensor, for example. The reference character P represents an axis of the temperature sensor 6 that is perpendicular to the temperature detection surface S of the temperature sensor 6 and indicates the orientation of the temperature detection surface S of the temperature sensor 6.

A temperature detection area 60 for which the temperature sensor 6 can detect temperatures is determined on the basis of the field-of-view angle φ.

Figure 4:
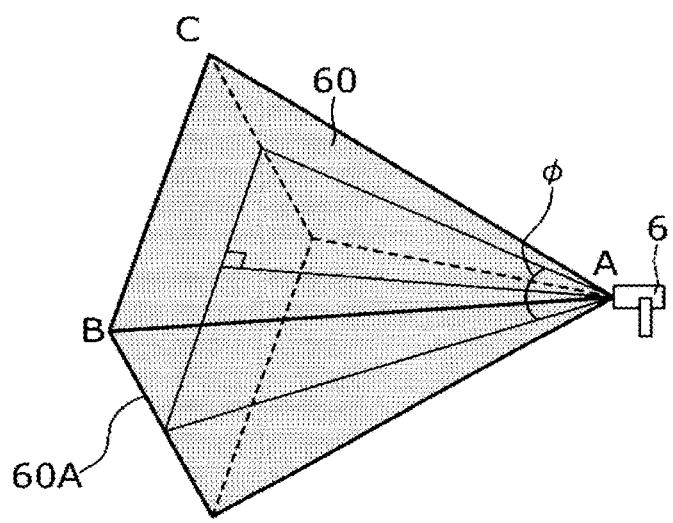
FIG. 4 is a diagram illustrating an example of a temperature detection area based on the field-of-view angle of a temperature sensor.

FIG. 4 illustrates an example of the temperature detection area 60 based on the field-of-view angle φ of the temperature sensor 6. In this embodiment, description is given under the assumption that the temperature detection area 60 of the temperature sensor 6 is in the form of a regular quadrangular pyramid, as illustrated in FIG. 4.

Figure 5:
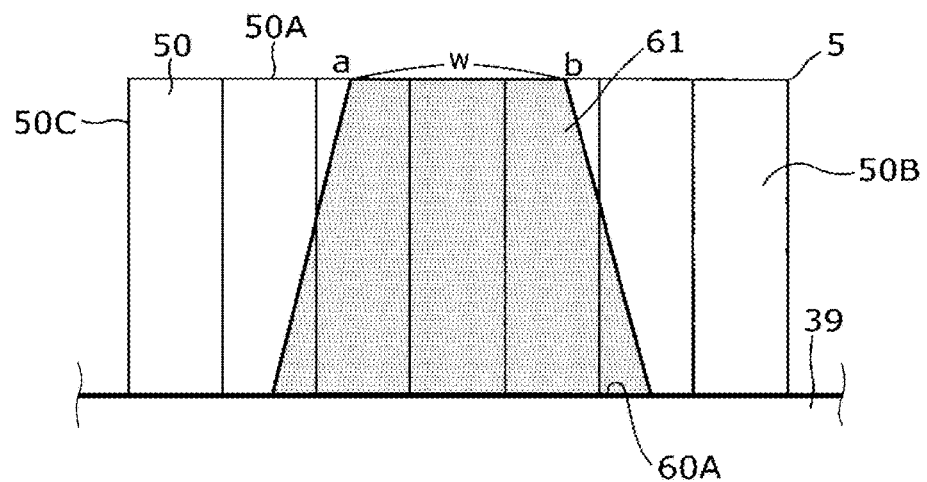
FIG. 5 is a diagram illustrating an example of a monitor area on a monitor-target rack row monitored by a temperature sensor.

In the case where the temperature detection area 60 of the temperature sensor 6 is in the form of a regular quadrangular pyramid, for example, the field-of-view angle φ is the angle associated with the vertex A of a triangle that is a cross-section obtained by cutting across the regular quadrangular pyramid from the vertex A of the regular quadrangular pyramid toward the base thereof perpendicularly. In this case, a monitor area 61, on the monitor-target rack row, that can be monitored by the temperature sensor 6 is as illustrated in FIG. 5. That is, an area (monitor area 61) on the monitor-target rack row 5_1 for which the surface temperature can be monitored by the temperature sensor 6 placed on the rack row 5_2 adjacent to the rack row 5_1 in the X-axis direction is identical to a cross-section of the temperature detection area 60 in the form of a regular quadrangular pyramid obtained by cutting across the temperature detection area 60 by the surface 50B of the monitor target rack row 5_1, and has a trapezoid shape, as illustrated in FIG. 5.

In the example case illustrated in FIG. 5, an area on the surface 50B of the rack row 5_1 for which the surface temperature can be monitored by one temperature sensor 6 corresponds to the monitor area 61, which is hatched in FIG. 5. Therefore, in order to monitor the entire surface 50B of the rack row 5_1 without omission, a plurality of the temperature sensors 6 need to be appropriately arranged in the Y-axis direction on one rack row, that is, the rack row

Figure 6:
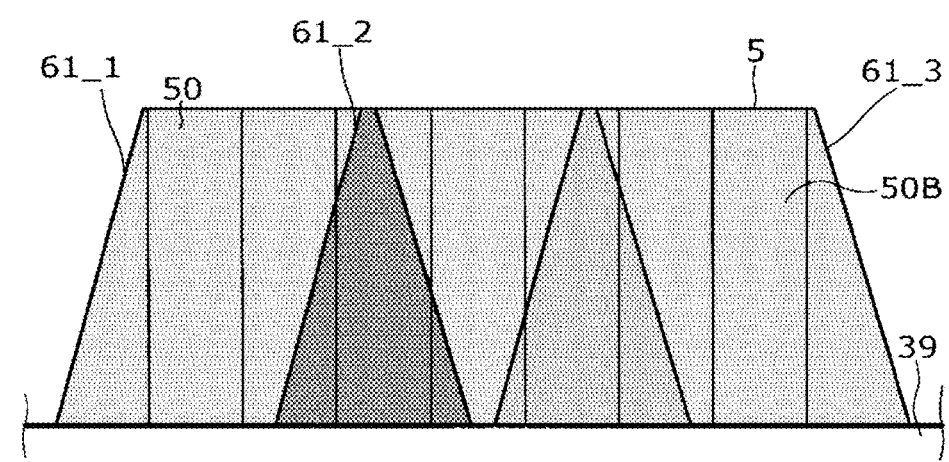
FIG. 6 is a diagram illustrating a relationship between a rack row and monitor areas in a case where a plurality of temperature sensors are arranged.

5_2, as illustrated in FIG. 2. Accordingly, the surface temperature of one rack row, that is, the rack row 5_1, can be monitored without omission, as illustrated in FIG. 6. Note that the monitor target is not limited to the entire rack row and may be specified as necessary.

Here, the length, in the Y-axis direction, of the monitor area 61 on the rack row 5 monitored by the temperature sensor 6 is referred to as a field-of-view width W. For example, as illustrated in FIG. 5, the length of the short side (upper base) ab of the monitor area 61, the length being determined when an edge of the base 60A of the temperature detection area 60, which is in the form of a regular quadrangular pyramid, of the temperature sensor 6 is aligned with the boundary between the rack row 5 and the floor 39, is defined as the field-of-view width W.

Assistance Apparatus

Next, an assistance apparatus 1 according to this embodiment is described.

Figure 7:
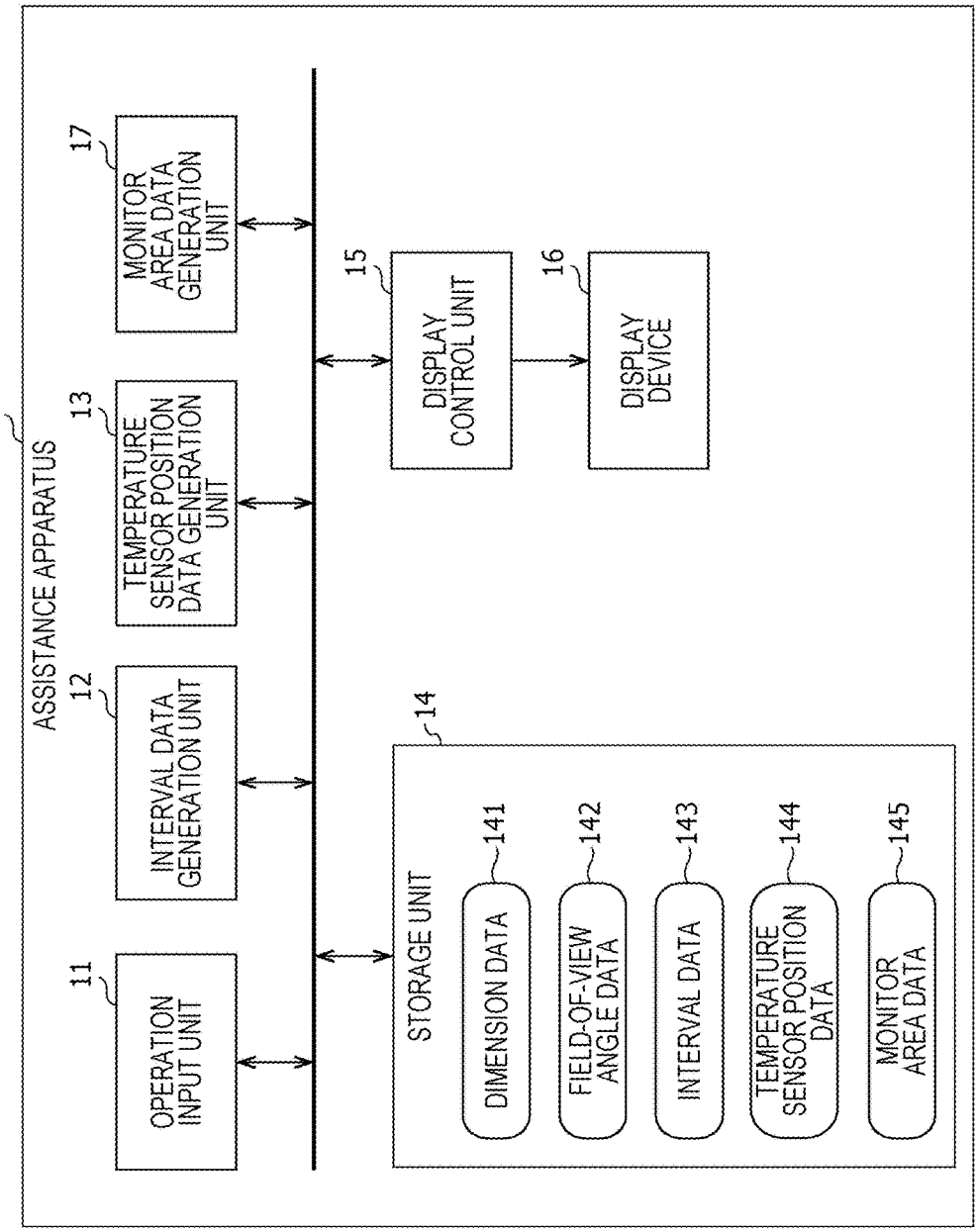
FIG. 7 is a diagram illustrating a configuration of the assistance apparatus according to an embodiment of the disclosure.

FIG. 7 is a diagram illustrating a configuration of the assistance apparatus 1 according to an embodiment of the disclosure.

The assistance apparatus 1 according to this embodiment is an apparatus for assisting placement of the temperature sensors 6 in the temperature monitoring system 100 described above and has a function of automatically calculating the monitor areas 61 of the temperature sensors 6, a function of causing the display device to display monitor coverage information including information about the calculated monitor areas 61 together with arrangement information about the rack rows, and a function of calculating recommended temperature sensor placement positions.

As illustrated in FIG. 7, the assistance apparatus 1 includes an operation input unit 11, an interval data generation unit 12, a temperature sensor position data generation unit 13, a storage unit 14, a display control unit 15, a monitor area data generation unit 17, and a display device 16.

The assistance apparatus 1 is implemented by, for example, using a computer, which is a hardware resource, and a program installed on the computer. More specifically, hardware resources that constitute the computer, namely, a program processing device, such as a central processing unit (CPU), memory devices, such as a random access memory (RAM), a read-only memory (ROM), and a hard disk drive (HDD), input devices, such as a keyboard, a mouse, and a touch panel, used to externally input information, a communication device for transmitting and receiving various types of information in a wired or wireless manner via a communication line, such as a LAN, and a display device, such as an LCD, are controlled in accordance with the program to thereby implement the operation input unit 11, the temperature sensor position data generation unit 13, the interval data generation unit 12, the storage unit 14, and the display control unit 15. The program may be recorded to a recording medium, such as a compact disc read-only memory (CD-ROM), a digital versatile disc read-only memory (DVD-ROM), or a memory card, and provided.

The operation input unit 11 includes a keyboard, a mouse, and a touch panel, for example, used by the user to input an operation, and outputs a signal corresponding to the operation.

The interval data generation unit 12 is a functional unit that generates interval data 143, which includes an interval d, in the X-axis direction, between the rack rows 5 that are adjacent to each other in the X-axis direction in the three-dimensional space 30.

The monitor area data generation unit 17 is a functional unit that generates monitor area data 145, which includes information about the monitor areas 61 of the temperature sensors 6, on the basis of dimension data 141, field-of-view angle data 142, the interval data 143, and temperature sensor position data 144.

The temperature sensor position data generation unit 13 is a functional unit that generates the temperature sensor position data 144 that indicates temperature sensor placement positions in the three-dimensional space 30. In a case where an image of an icon or the like that represents a temperature sensor is displayed on a screen as a result of a user operation, such as a drag-and-drop operation, using a mouse or the like, for example, the temperature sensor position data generation unit 13 generates the temperature sensor position data 144 on the basis of a signal that is output from the operation input unit 11 and that corresponds to the operation. Although detailed description is given below, the temperature sensor position data generation unit 13 automatically generates the temperature sensor position data 144 that indicates a recommended temperature sensor placement position on the basis of the dimension data 141, the field-of-view angle data 142, and the interval data 143.

The storage unit 14 is a functional unit that stores various types of data used in calculation performed by the monitor area data generation unit 17. The storage unit 14 stores in advance the dimension data 141 and the field-of-view angle data 142, for example. The dimension data 141 is data of the rack rows 5 and includes the length L of each rack row 5 in the Y-axis direction and the length (height) h of each rack row 5 in the Z-axis direction. The field-of-view angle data 142 includes the field-of-view angle φ of each temperature sensor 6. The storage unit 14 further includes the interval data 143, which is generated by the interval data generation unit 12, the temperature sensor position data 144, which is generated by the temperature sensor position data generation unit 13, and the monitor area data 145, which is generated by the monitor area data generation unit 17.

The display control unit 15 is a functional unit that causes the display device 16, which is an LCD, for example, to display various types of information. For example, the display control unit 15 displays, on the screen of the display device 16, an arrangement area 41, which corresponds to the X-Y plane of the three-dimensional space 30, in accordance with a user operation input via the operation input unit 11. The display control unit 15 further displays, on the basis of the dimension data 141, the temperature sensor position data 144, and the monitor area data 145, for example, stored in the storage unit 14, a rack row icon 45, which represents any of the rack rows 5, a temperature sensor icon 46, which represents any of the temperature sensors 6, and monitor coverage information, such as the monitor area 61 based on the field-of-view angle φ of the temperature sensor 6, on the screen of the display device 16. Note that the rack row icon 45 is an example of a rack row image, and the temperature sensor icon 46 is an example of a temperature sensor image.

Figure 8:
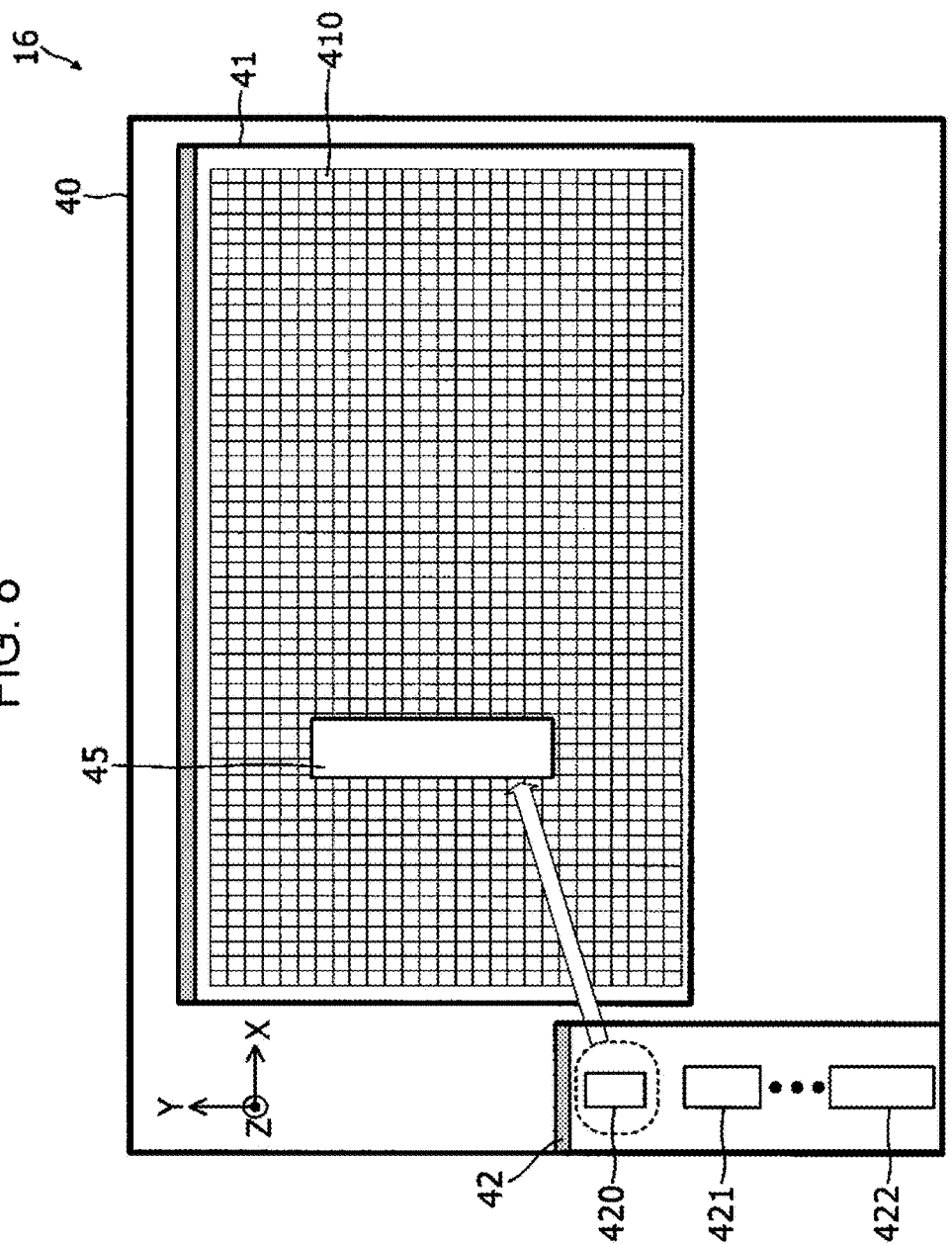
FIG. 8 is a diagram illustrating an example of a display screen displayed on a display device of the assistance apparatus.
Figure 9:
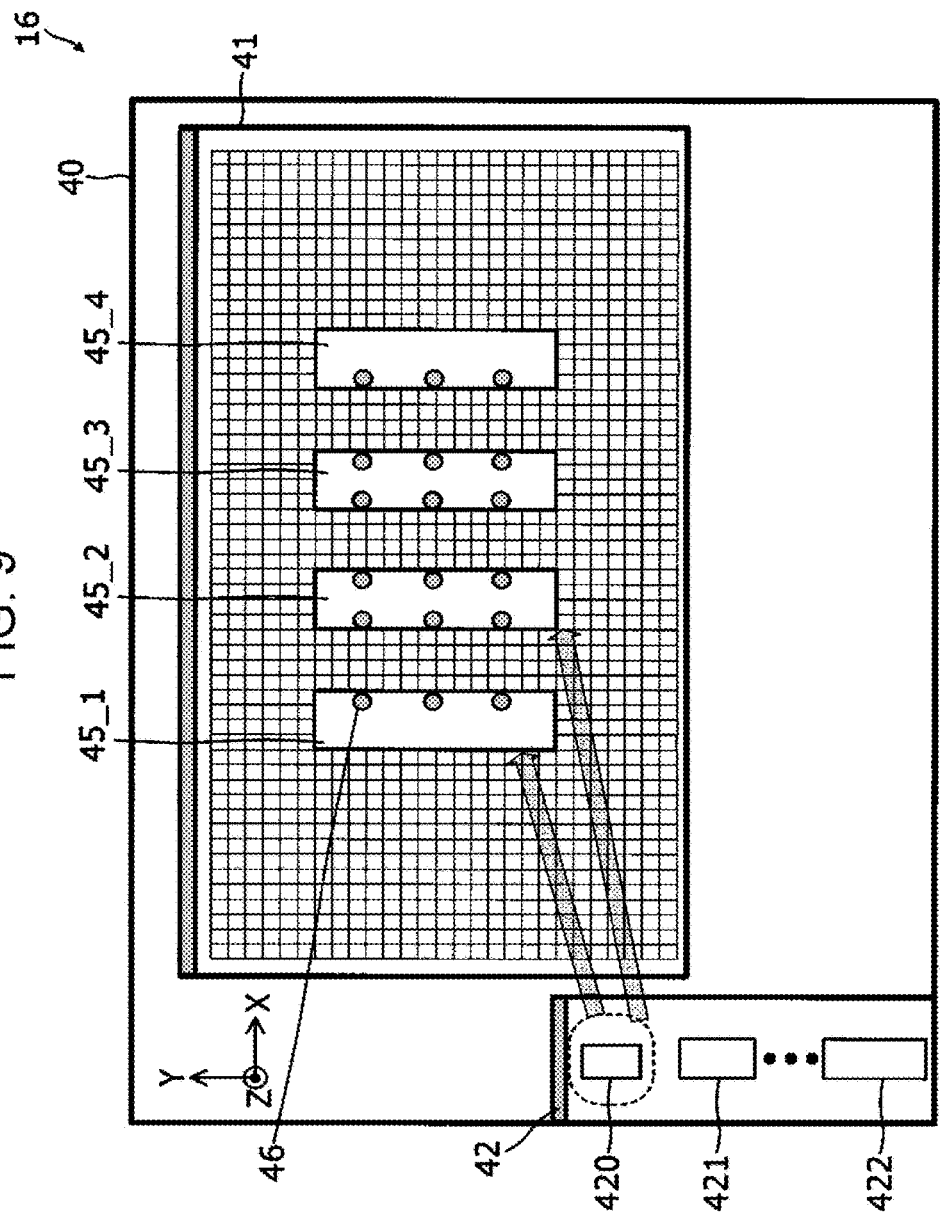
FIG. 9 is a diagram illustrating an example of the display screen displayed on the display device of the assistance apparatus.
Figure 10:
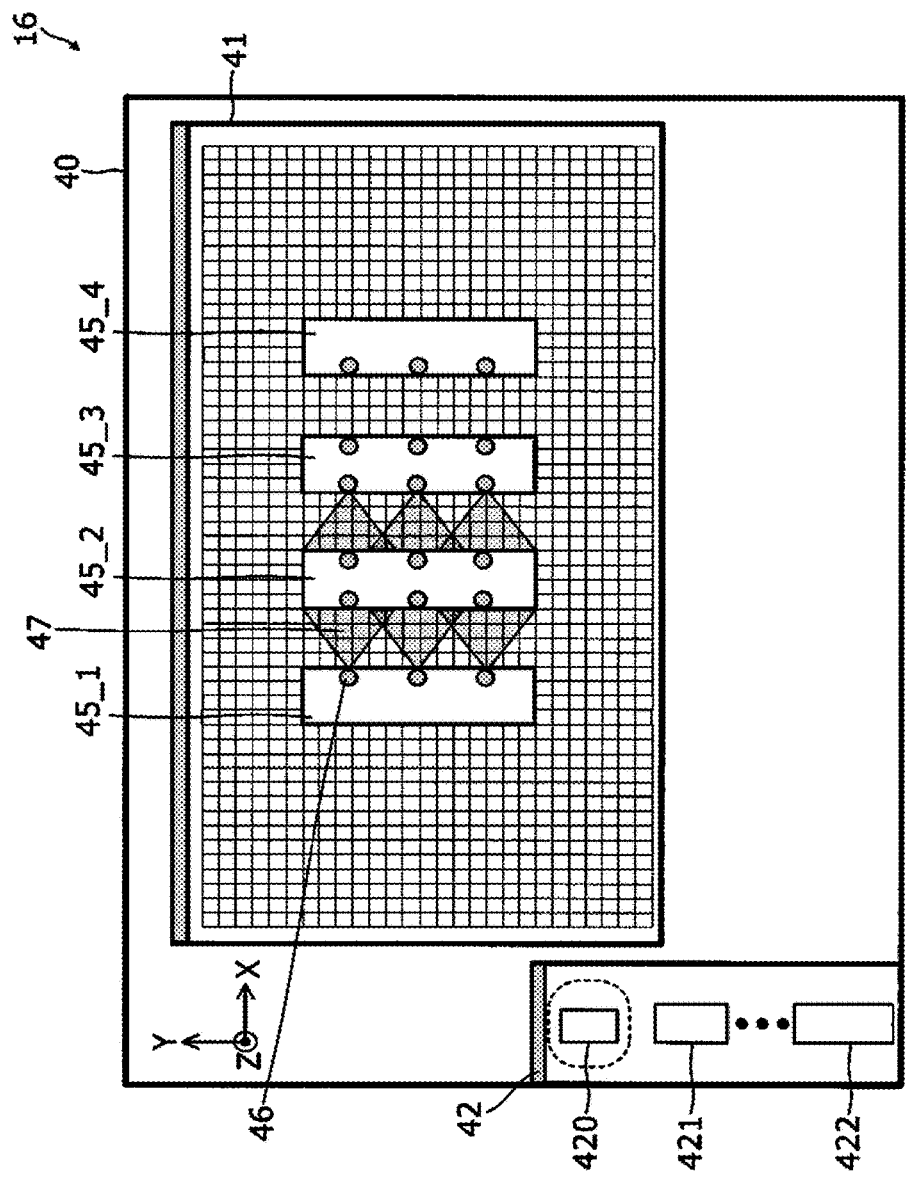
FIG. 10 is a diagram illustrating an example of the display screen displayed on the display device of the assistance apparatus.

FIGS. 8 to 10 are diagrams each illustrating an example of a display screen displayed on the display device 16 of the assistance apparatus 1.

An example case is described below where the temperature sensor position data generation unit 13 automatically calculates, on the basis of the dimension data 141, the field-of-view angle data 142, and the interval data 143, the temperature sensor position data 144 so that one surface of a rack row of interest is entirely covered by the monitor areas 61 of a plurality of temperature sensors as a monitor target.

As illustrated in FIGS. 8 to 10, the assistance apparatus 1 displays, on a display screen 40 of the display device 16, the arrangement area 41, which corresponds to the X-Y plane of the space 30, and a pallet area 42, which includes at least one pallet that corresponds to any of the rack rows 5 that can be placed in the space 30. The grid (scale), for example, is displayed on the arrangement area 41 to represent a length on the X-Y plane of the space 30.

For example, in a case where the user inputs, via the operation input unit 11, a drag-and-drop operation for dragging a pallet 420, which represents a predetermined one of the rack rows 5, from the pallet area 42 to the arrangement area 41, the operation input unit 11 outputs a signal that corresponds to the operation, and the display control unit 15 displays the rack row icon 45 that corresponds to the selected rack row 5 in the arrangement area 41 in accordance with the signal output from the operation input unit 11.

In a case where the user inputs, via the operation input unit 11, a drag-and-drop operation for dragging the rack row icon 45 that is arranged in the arrangement area 41, the operation input unit 11 outputs a signal that corresponds to the operation, and the display control unit 15 changes the display position of the selected rack row icon 45 in the arrangement area 41 in accordance with the signal output from the operation input unit 11 (moves the rack row icon 45).

By performing operations similar to the operations described above with reference to FIG. 8, rack row icons 45_1 to 45_m (m is an integer larger than or equal to two) that correspond to a plurality of the rack rows 5 can be arranged in the arrangement area 41, as illustrated in FIG. 9.

Here, in a case where rack row icons 45 adjacent to each other among the rack row icons 45_1 to 45_m respectively have surfaces that at least partially face each other in the X-axis direction, the assistance apparatus 1 according to this embodiment displays, in the arrangement area 41 as monitor coverage information, the temperature sensor icons 46 that represent the temperature sensors 6 placed on each of the rack rows adjacent to each other to monitor the temperature of the entire surface of the other rack row. That is, the user is made to recognize in advance that the temperature sensor positions are calculated so that each of the displayed rack rows are covered by the monitor areas of a plurality of temperature sensors as a monitor target. Then, the temperature sensor icons 46 are displayed as information indicating the monitor areas. Note that the specific method for displaying the temperature sensor icons 46 is described below.

As illustrated in FIG. 10, the assistance apparatus 1 displays icons 47, which respectively represent the monitor areas 61, as monitor coverage information.

Here, the shape of the icons 47 is not limited to a specific shape; however, it is preferable that each of the icons 47 be an indication with which the monitor area 61 can be recognized in the Z-axis direction, for example, as illustrated in FIG. 10. More specifically, it is preferable that each of the icons 47 be an indication with which the field-of-view width W of the monitor area 61 can be recognized. For example, the icon 47 may have a triangle shape obtained by connecting the points a and b (which represent the field-of-view width W) of the monitor area 61 illustrated in FIG. 5 with a point on the temperature detection surface S of the temperature sensor 6. Alternatively, a linear icon that represents the field-of-view width W may be displayed on a portion of each of the rack row icons 45_1 to 45_m, the portion corresponding to the line that connects the points a and b of the monitor area 61 illustrated in FIG. 5, or the portion may be displayed by simply changing the color without using an icon.

As the method for displaying the icon 47, which represents the monitor area 61, the display control unit 15 may automatically display the icon 47 on the basis of the monitor area data 145 regardless of an operation input by the user when the temperature sensor icon 46 is arranged on the screen. Alternatively, the display control unit 15 may display the icon 47 on the basis of the monitor area data 145 in accordance with an operation input by the user. For example, in a case where the user inputs, via the operation input unit 11, an operation for selecting one of the temperature sensor icons 46 displayed in the arrangement area 41, the operation input unit 11 may output a signal that corresponds to the operation, and the display control unit 15 may display, in the arrangement area 41, the icon 47 that represents the monitor area 61 of the temperature sensor 6 corresponding to the selected temperature sensor icon 46 in accordance with the signal output from the operation input unit 11, as illustrated in FIG. 10.

Now, the method for displaying monitor coverage information is described in detail.

Here, an example case is described where mouse operations, for example, are performed by the user as follows. One of the pallets 420 to 422 is selected from the pallet area 42 and is dragged to and dropped on the arrangement area 41, and a rack row is displayed on the screen accordingly, and thereafter, the temperature sensor icon 46 is arranged on the rack row by a drag-and-drop operation, for example, performed by the user.

Figure 11:
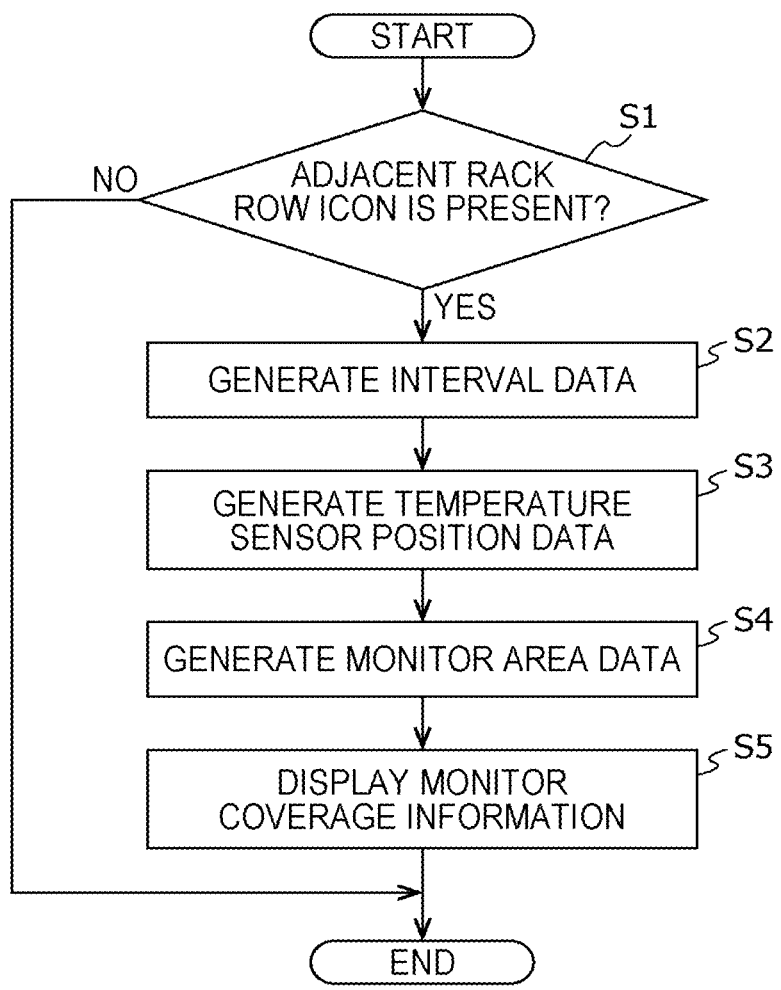
FIG. 11 is a flowchart illustrating a flow of a process for displaying monitor coverage information.

FIG. 11 is a flowchart illustrating the flow of the process for displaying monitor coverage information.

First, when the rack row icon 45 that corresponds to one pallet selected by a mouse operation, for example, performed by the user is displayed in the arrangement area 41, for example, the interval data generation unit 12 determines whether another rack row icon 45 having a surface that at least partially faces part of a surface of the displayed rack row icon 45 in the X-axis direction is present (step S1).

If it is determined that such a rack row icon 45 is not present (No in step S1), the interval data generation unit 12 does not generate the interval data 143, and the display control unit 15 keeps displaying only the rack row icon 45 that corresponds to the selected pallet in the arrangement area 41, and the process for displaying monitor coverage information ends.

On the other hand, if it is determined that such a rack row icon 45 is present (Yes in step S1), the interval data generation unit 12 generates the interval data 143 (step S2) Specifically, the interval data generation unit 12 calculates, from the distance, in the arrangement area 41, between the two rack row icons 45 displayed in the arrangement area 41 and adjacent to each other, the distance (interval d) between two rack rows 5 that correspond to the two rack row icons 45 described above in the X-axis direction in the space 30, and stores the interval data 143 that includes the calculated interval d in the storage unit 14.

Next, when the temperature sensor icon 46 is arranged on the rack row icon 45 of interest displayed on the screen as a result of an operation, such as a drag-and-drop operation, performed by the user, for example, the temperature sensor position data generation unit 13 generates the temperature sensor position data 144 (step S3) Specifically, the temperature sensor position data generation unit 13 generates, on the basis of the position of the temperature sensor icon 46 on the screen, the temperature sensor position data 144 that includes information about the X, Y, and Z coordinates of the temperature sensor 6 in the space 30, and stores the generated temperature sensor position data 144 in the storage unit 14.

Here, it is assumed that the temperature sensor 6 is arranged along a surface of a rack row that faces a monitor-target rack row, the surface facing the monitor-target rack row, and the user can determine the Y coordinate of the temperature sensor 6 by operating the temperature sensor icon 46. That is, the X coordinate of the temperature sensor 6 is determined on the basis of the X coordinate of the rack row, and the Y coordinate of the temperature sensor 6 is determined on the basis of the position, on the screen, of the temperature sensor icon 46 arranged by the user. When it is assumed that the height of the temperature sensor 6 in the Z-axis direction need not be taken into consideration relative to the height of the rack row 5 in the Z-axis direction, the Z coordinate of the temperature sensor 6 is equal to the height (h) of the rack row 5 on which the temperature sensor 6 is placed.

Next, the monitor area data generation unit 17 generates the monitor area data 145 (step S4).

Specifically, first, the monitor area data generation unit 17 reads, from the storage unit 14, the field-of-view angle data 142 that corresponds to the type of the specified temperature sensor 6, the dimension data 141, and the interval data 143 generated in step S2, and calculates the field-of-view width W on the basis of the read data.

Figure 12:
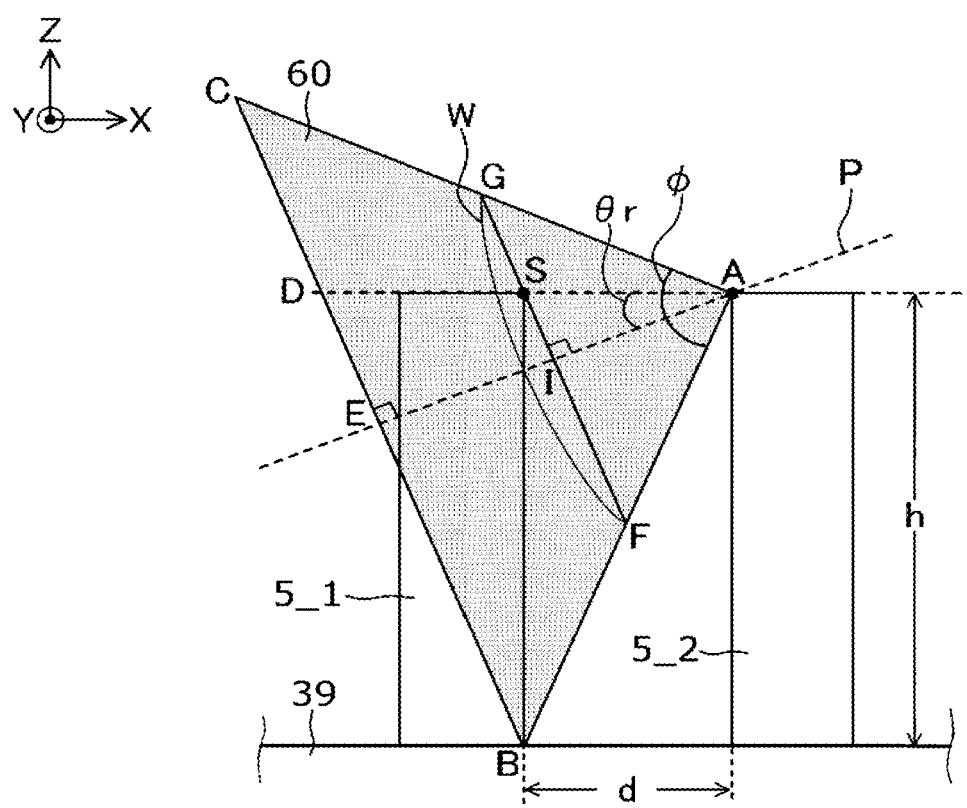
FIG. 12 is a diagram for describing a method for calculating a field-of-view width.

FIG. 12 is a diagram for describing the method for calculating the field-of-view width W.

As described above, in FIG. 12, it is assumed that the temperature sensor 6 is arranged on the upper surface of the rack row 5_2 in an end portion A, which is on a side close to the monitor target rack row 5_1, and that the height of the temperature sensor 6 in the Z-axis direction need not be taken into consideration relative to the height of the rack row 5_2 in the Z-axis direction. Further, it is assumed that L≥W is satisfied.

As described above, the field-of-view width W is the length of the monitor area 61 on the rack row 5 monitored by the temperature sensor 6 in the Y-axis direction and is the length of the short side ab of the monitor area 61 that is determined when the angle θr is set to a value at which a lower side face of the temperature detection area 60, which is in the form of a regular quadrangular pyramid, of the temperature sensor 6 is in contact with the boundary between the rack row 5 and the floor 39 (see FIG. 5).

In the X_Z plane of the space 30 illustrated in FIG. 12, the field-of-view width W is equal to the length of the segment GF, which is parallel to the edge CB of the base 60A of the temperature detection area 60 (perpendicular to the axis P, which is the bisector of the angle φ) and which passes through the end portion S on the upper surface of the monitor-target rack row 5_1.

Accordingly, in step S4, the monitor area data generation unit 17 calculates the field-of-view width W by using equation (1) below, where d is the interval between the rack row 5_1 and the rack row 5_2, φ is the field-of-view angle of the temperature sensor 6, and θr is the angle made by the segment AD, which is parallel to the surface of the floor 39 and which passes through the points A and S, and the axis P, θr being expressed by equation (2) below. In equation (2), h is the height of the rack rows 5_1 and 5_2.

$$W = 2d \cos \theta r \tan \frac{\phi}{2} \quad (1)$$

$$\theta r = \tan^{-1}\left(\frac{h \cos \frac{\phi}{2} - d \sin \frac{\phi}{2}}{h \sin \frac{\phi}{2} + d \cos \frac{\phi}{2}}\right) \quad (2)$$

Next, the monitor area data generation unit 17 generates the monitor area data 145 on the basis of the calculated field-of-view width W and the temperature sensor position data 144 generated in step S3. More specifically, the monitor area data generation unit 17 generates information indicating the length of the icon 47 in the Y-axis direction (the display range in the Y-axis direction) on the basis of the field-of-view width W, generates information indicating a position (X and Y coordinates) on the screen at which the icon 47 is displayed on the basis of the temperature sensor position data 144, and stores the information in the storage unit 14 as the monitor area data 145.

Subsequently, the display control unit 15 displays monitor coverage information on the screen on the basis of the monitor area data 145 generated in step S4 (step S5). Specifically, the display control unit 15 displays the icon 47, which represents the monitor area 61, in the arrangement area 41 as monitor coverage information on the basis of the monitor area data 145.

Now, the method for displaying the temperature sensor icons 46 in a case of automatically calculating the temperature sensor position data 144 is described in detail.

Figure 13:
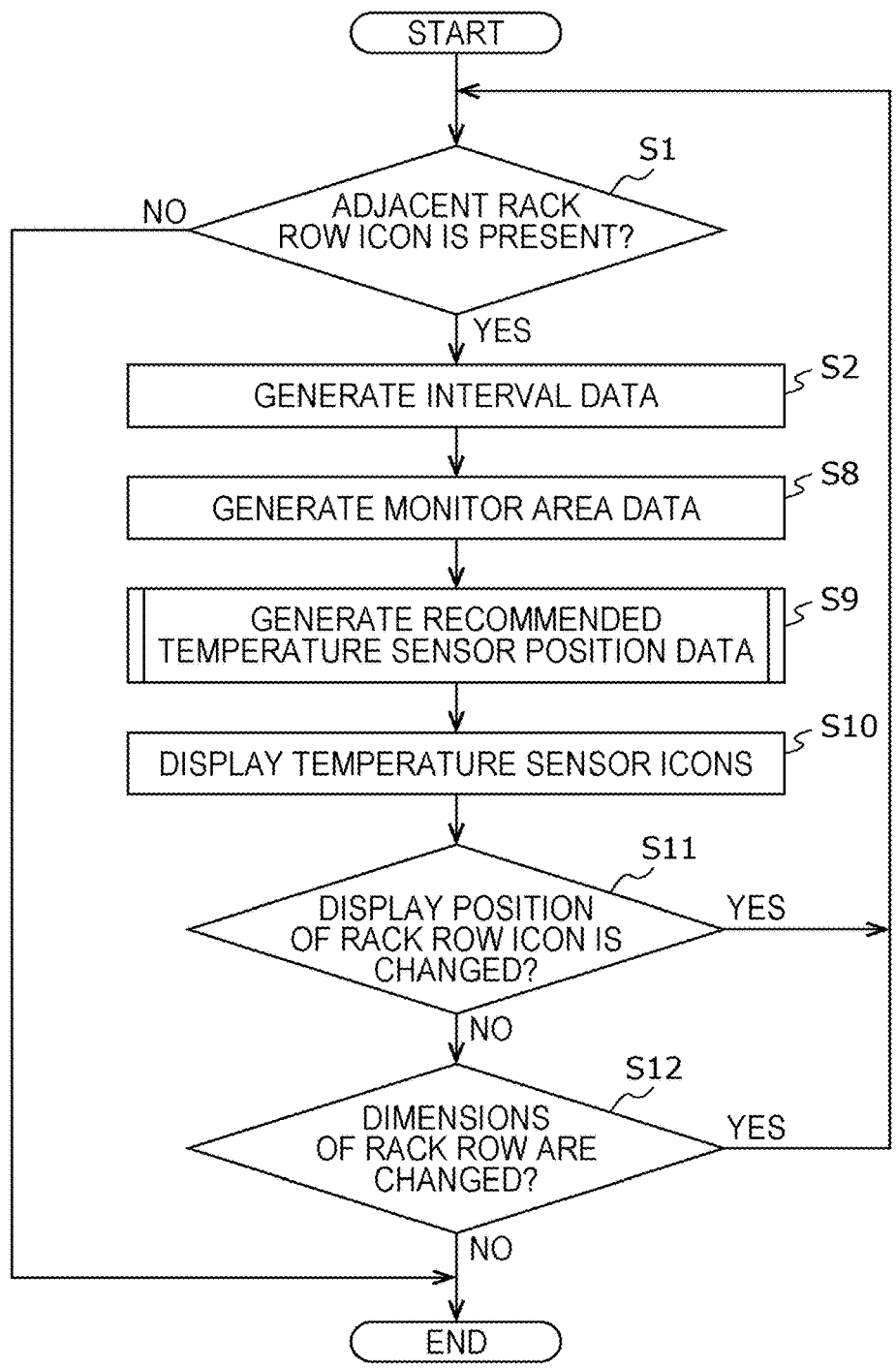
FIG. 13 is a flowchart illustrating a flow of a process for displaying temperature sensor icons.

FIG. 13 is a flowchart illustrating the flow of the process for displaying the temperature sensor icons 46.

First, the process up to generation of the interval data is the same as in steps S1 and S2 in FIG. 11 described above. That is, when the rack row icon 45 that corresponds to one pallet selected by a mouse operation, for example, performed by the user is displayed in the arrangement area 41, the interval data generation unit 12 determines whether another rack row icon 45 having a surface that at least partially faces part of a surface of the displayed rack row icon 45 in the X-axis direction is present. If it is determined that such a rack row icon 45 is not present, only the rack row icon 45 is kept displayed in the arrangement area 41, and the process for displaying monitor coverage information ends. If it is determined that such a rack row icon 45 is present, the interval data generation unit 12 generates and stores the interval data 143 in the storage unit 14. The method for generating the interval data 143 is as described above.

Next, the monitor area data generation unit 17 generates the field-of-view width W (step S8). The method for calculating the field-of-view width W is the same as in step S4 in FIG. 11 described above.

Subsequently, the temperature sensor position data generation unit 13 generates the temperature sensor position data 144 (hereinafter referred to as "recommended temperature sensor position data 144") that indicates recommended positions of the temperature sensors on the basis of the interval data 143 generated in step S2, the dimension data 141, the field-of-view angle data 142, and the field-of-view width W calculated in step S8 (step S9). The details of the process in step S9 is specifically described below.

Subsequently, the display control unit 15 displays the temperature sensor icons 46 in the arrangement area 41 as monitor coverage information on the basis of the recommended temperature sensor position data 144 generated in step S9 (S10). At this time, the icons 47, which represent the monitor areas 61, may be displayed as monitor coverage information.

Thereafter, the temperature sensor position data generation unit 13 determines whether the display position of any rack row icon 45 is changed in the arrangement area 41 (step S11). For example, if one of the rack row icons 45 displayed in the arrangement area 41 is selected by a user operation and is moved to another position within the arrangement area 41 (Yes in step S11), the flow returns to step S1, and the above-described process (steps S1 to S10) is performed again. As a result, the recommended temperature sensor position data 144 related to the moved rack row icon 45 is updated, and monitor coverage information is updated on the basis of the updated recommended temperature sensor position data 144.

Figure 14:
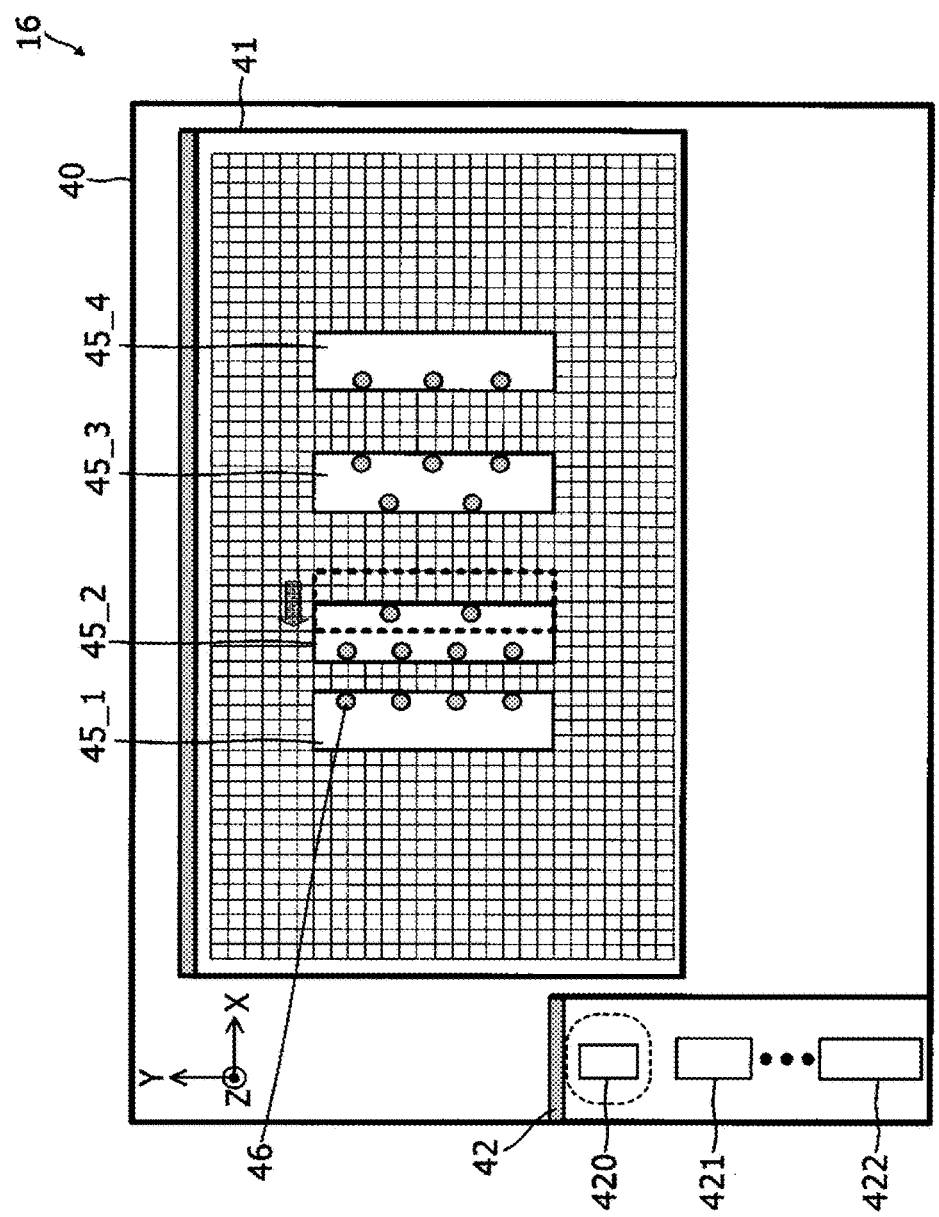
FIG. 14 is a diagram illustrating an example of the display screen displayed on the display device of the assistance apparatus.
Figure 15:
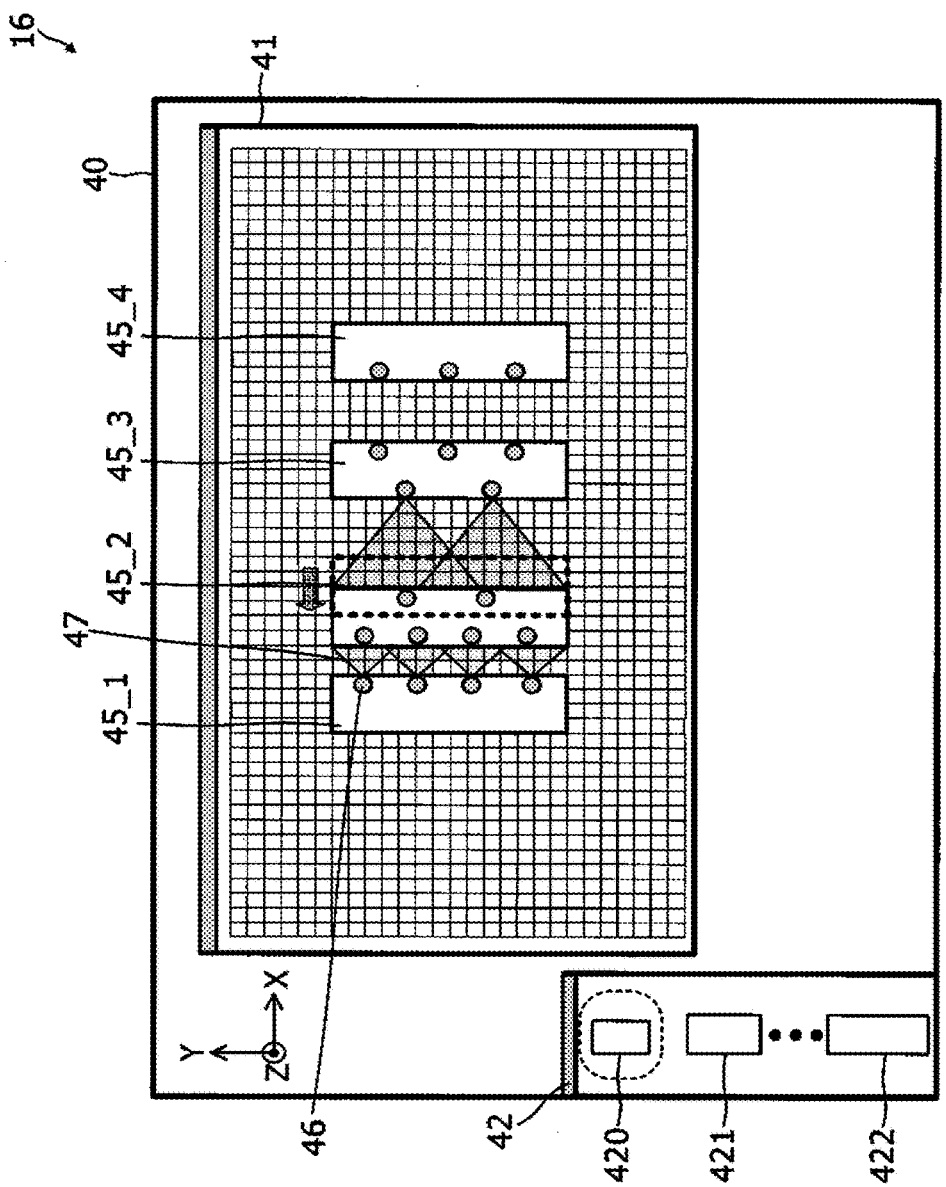
FIG. 15 is a diagram illustrating an example of the display screen displayed on the display device of the assistance apparatus.

Specifically, as illustrated in FIG. 14, in a case where, for example, the rack row icon 45_2 is moved leftward (−X-axis direction) in the arrangement area 41, the interval d between the rack row corresponding to the rack row icon 45_1 and the rack row corresponding to the rack row icon 45_2 becomes smaller than that before movement, and the interval d between the rack row corresponding to the rack row icon 45_2 and the rack row corresponding to the rack row icon 45_3 becomes larger than that before movement. Therefore, the interval data 143 based on the interval between the rack row icon 45_1 and the rack row icon 45_2 and the interval data 143 based on the interval between the rack row icon 45_2 and the rack row icon 45_3 are updated, and the temperature sensor icons 46 arranged on the rack row icons 45_1 to 45_3 are refreshed (the number of sensors and the arrangement thereof are updated) together with the rack row icon 45_2. At this time, in a case where the icons 47 representing the monitor areas of the temperature sensors 6 that are updated are displayed, the icons 47 are also refreshed together with the temperature sensor icons 46, as illustrated in FIG. 15.

On the other hand, if the display position of any rack row icon 45 is not changed, that is, any rack row icon 45 is not moved after the temperature sensor icons 46 have been displayed (No in step S11), the temperature sensor position data generation unit 13 determines whether the dimension data 141 of the rack row 5 that corresponds to any of the displayed rack row icons 45 is changed (step S12).

For example, in a case where the height h of the rack row 5 that corresponds to any of the displayed rack row icons 45 is changed by a user operation via the operation input unit 11 (Yes in step S12), the flow returns to step S1, and the process described above (steps S1 to S11) is performed again by using the changed dimension data 141. As a result, the recommended temperature sensor position data 144 and the monitor area data 145 related to the rack row icon 45 for which the height h is changed are updated, and the display positions of the corresponding temperature sensor icons 46 are updated and the icons 47 are refreshed on the basis of the recommended temperature sensor position data 144 and the monitor area data 145 that have been updated.

In a case where the length L of the rack row 5 that corresponds to any of the displayed rack row icons 45 is changed (Yes in step S12), the process described above (steps S1 to S11) is performed again on the basis of the changed dimension data 141. The recommended temperature sensor position data 144 related to the rack row icon 45 for which the length L is changed is updated, and the display positions of the corresponding temperature sensor icons 46 are updated on the basis of the updated recommended temperature sensor position data 144.

On the other hand, in a case where the length L or the height h of any rack row 5 is not changed (No in step S12), the recommended temperature sensor position data 144 is not changed, and the display positions of the temperature sensor icons 46 are not updated.

With the process described above, the temperature sensor icons 46 can be displayed on the screen.

Now, the method for generating the recommended temperature sensor position data 144 in step S9 described above is described in detail.

Here, an example case is described where data that indicates the positions of temperature sensors with which the number of temperature sensors necessary for a monitor-target rack row to be included in the monitor area is minimized is generated as the recommended temperature sensor position data 144.

Figure 16:
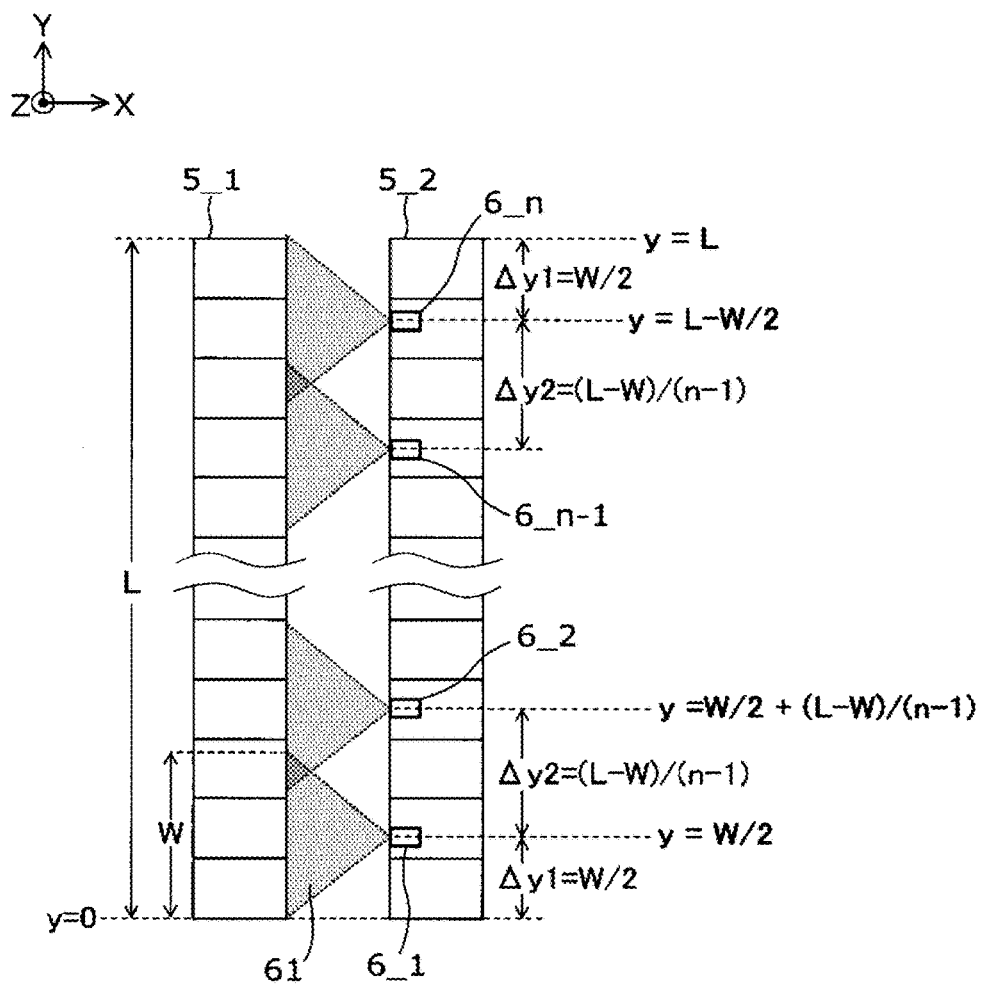
FIG. 16 is a diagram for describing a method for generating recommended temperature sensor position data.

FIG. 16 is a diagram for describing the method for generating the recommended temperature sensor position data 144.

For facilitating understanding, the following description is given under the assumption that two rack rows adjacent to each other in the X-axis direction are arranged such that at least one of the surfaces of one of the rack rows faces that of the other rack row, and the surface temperature of one of the rack rows is monitored by the temperature sensors placed on the upper surface of the other rack row, and that the rack rows are arranged in the X-axis direction such that that the surface to be monitored is parallel to the Y-axis, for example. It is assumed that the heights h of the respective rack rows are the same. It is further assumed that the temperature sensors 6 are arranged on the upper surface of the other rack row in an end portion that is on a side close to the monitor-target rack row, and that the orientation of each of the temperature sensors 6 (the axis P) is perpendicular to the Y-axis direction.

In the method for generating the recommended temperature sensor position data 144 according to this embodiment, the temperature sensors 6 are arranged at positions away from the respective ends of the rack row 5_2 by a predetermined distance in the Y-axis direction, the rack row 5_2 being adjacent to the monitor-target rack row 5_1, as illustrated in FIG. 16. In a case where an area that is not monitored by the temperature sensors 6 respectively arranged at the positions away from the respective ends of the rack row 5_2 is present, the recommended temperature sensor position data 144 is generated so as to further arrange additional temperature sensors 6 in addition to the temperature sensors 6 that have been arranged.

The recommended temperature sensor position data 144 includes, for example, the number of temperature sensors 6 necessary to monitor the surface temperature of the monitor-target rack row, the number being represented by n (n is an integer larger than or equal to one), and the position of each of the temperature sensors 6 in the Y-axis direction relative to the monitor-target rack row.

Here, the position of each temperature sensor 6 in the Y-axis direction is determined as follows, for example. When the surface 50C of the monitor target rack row 5_1, the surface 50C being one of the surfaces parallel to the X-axis direction, is assumed to be the reference (y=0), as illustrated in FIG. 16, the position of each temperature sensor 6 in the Y-axis direction is defined as the position relative to the reference. The position of each temperature sensor 6 in the Y-axis direction is determined on the basis of the distance $\Delta y1$ (=W/2) and the distance $\Delta y2$ (=(L−W)/(n−1)). The distance $\Delta y1$ (=W/2) is the distance between the temperature sensor 6_1 arranged close to one end of the rack row 5_2 in the Y-axis direction and a corresponding one of the end surfaces of the rack row 5_2 and/or the distance between the temperature sensor 6_n arranged closed to the other end of the rack row 5_2 in the Y-axis direction and the other end surface of the rack row 5_2. The distance $\Delta y2$ (=(L−W)/(n−1)) is the distance between the temperature sensors 6 that are adjacent to each other.

The flow of the process for generating the recommended temperature sensor position data 144 is described below with reference to FIG. 17.

Figure 17:
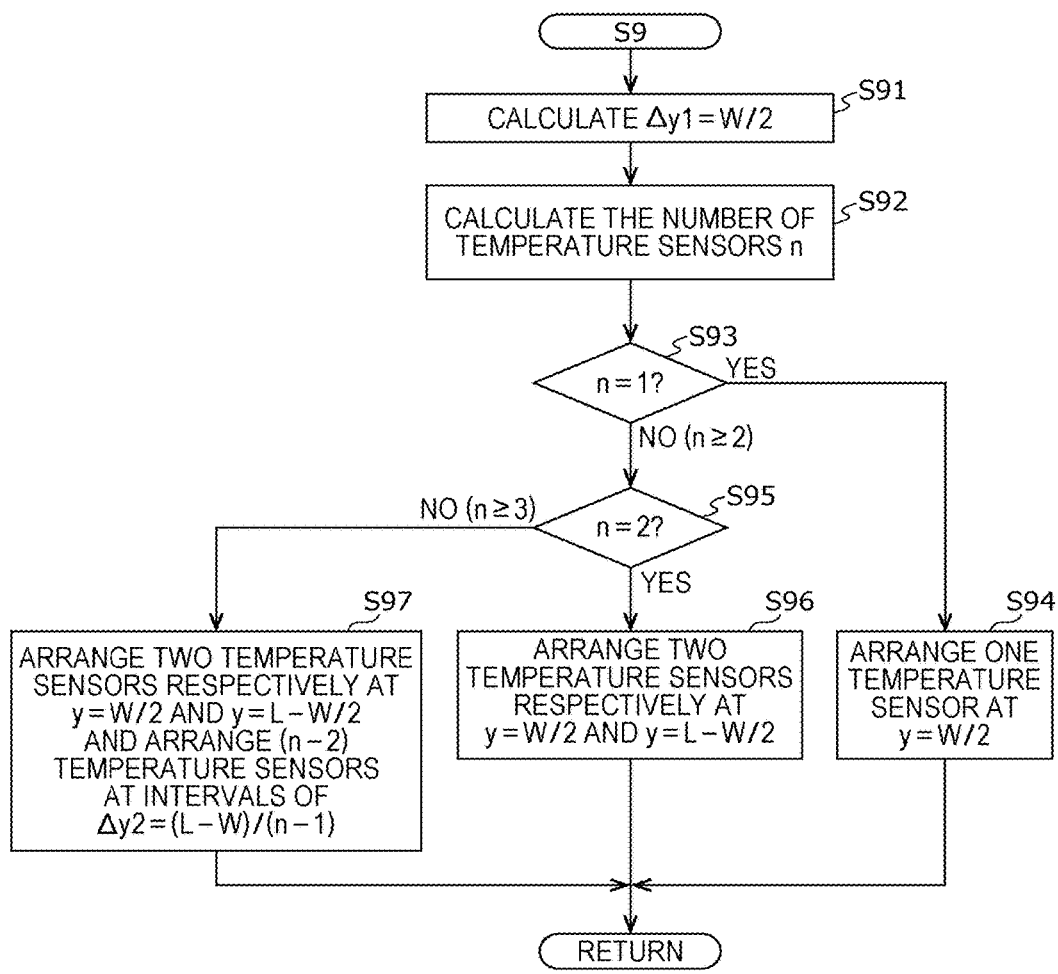
FIG. 17 is a flowchart illustrating a processing procedure in a method for generating temperature sensor position data.

FIG. 17 is a flowchart illustrating the processing procedure in the method for generating the recommended temperature sensor position data 144.

In the process for generating the recommended temperature sensor position data 144 in step S9, first, the temperature sensor position data generation unit 13 calculates the distance Δy1=W/2 on the basis of the field-of-view width W calculated in step S8 in FIG. 13 (step S91).

Next, the temperature sensor position data generation unit 13 calculates n, which is the number of temperature sensors necessary to monitor the temperature of the rack row 5_1 (step S92). The number of temperature sensors n is calculated by, for example, using equation (3) below, where ceil(p) is a function that returns the smallest integer larger than or equal to p, and L is the length of the rack rows 5_1 and 5_2 in the Y-axis direction.

$$n = ceil\left(\frac{L}{W}\right) \quad (3)$$

Subsequently, the temperature sensor position data generation unit 13 determines whether the number of temperature sensors n calculated in step S92 is equal to 1 (step S93). If n=1 is satisfied (Yes in step S93), the temperature sensor position data generation unit 13 generates the recommended temperature sensor position data 144 so as to arrange one temperature sensor 6 on the rack row adjacent to the monitor-target rack row in the X-axis direction at a position corresponding to y=W/2 (step S94).

On the other hand, if n=1 is not satisfied (No in step S93), that is, n≥2 is satisfied, the temperature sensor position data generation unit 13 determines whether n=2 is satisfied (step S95).

If n=2 is satisfied (Yes in step S95), the temperature sensor position data generation unit 13 generates the recommended temperature sensor position data 144 so as to arrange the temperature sensors 6 on the rack row adjacent to the monitor-target rack row at a position corresponding to y=W/2 and at a position corresponding to y=(L−W/2) respectively (step S96).

On the other hand, if n=2 is not satisfied (No in step S95), that is, n≥3 is satisfied, the temperature sensor position data generation unit 13 generates the recommended temperature sensor position data 144 so as to arrange the temperature sensors 6_1 and 6_n on the rack row adjacent to the monitor-target rack row at the position corresponding to y=W/2 and at the position corresponding to y=(L−W/2) respectively and to arrange (n−2) temperature sensors 6 over a range between y=W/2 and y=(L−W/2) at intervals of Δy2=(L−W)/(n−1) (step S97).

Effects of Assistance Apparatus

With the assistance apparatus according to this embodiment, the monitor area data 145 is generated on the basis of the dimension data 141 of a monitor-target rack row, the interval data 143 regarding rack rows adjacent to each other, the field-of-view angle data 142, and the temperature sensor position data 144, and monitor coverage information including the monitor areas 61 is displayed on the display device on the basis of the generated monitor area data 145, which allows the user to intuitively recognize the monitor areas 61. Accordingly, when temperature sensor arrangement is planned in a case of introduction of a temperature monitoring system or in a case of a layout change of a data center to which a temperature monitoring system has been introduced, a change in any monitor area 61 in accordance with the interval between rack rows can be checked. As a result, the placement locations and the number of necessary temperature sensors can be easily estimated in advance, which leads to a decrease in the operation cost. Further a change in the monitor area is less likely to be overlooked, or a calculation error is less likely to occur, and ordering of surplus temperature sensors or additional ordering of temperature sensors can be avoided.

That is, with the assistance system according to this embodiment, costs for introducing a temperature monitoring system can be reduced.

Further, with the assistance system according to this embodiment, the rack row icons 45 (for example, the rack row icon 45_1 and the rack row icon 45_2) are displayed on the graphical screen (arrangement area 41) that represents the three-dimensional space, and the interval data 143 is generated and updated on the basis of the distance, in the X-axis direction, between the displayed rack row icon 45_1 and the displayed rack row icon 45_2 adjacent to the rack row icon 45_1 in the X-axis direction. Therefore, users' convenience increases when both the arrangement of the temperature sensors and that of the rack rows are designed. For example, in a case of a layout change, for example, where the arrangement of rack rows is not fixed and is to be determined while, for example, taking into consideration the number of sensors, the assistance system according to this embodiment is specifically effective.

The temperature sensor icons 46, which represent the temperature sensors 6, are displayed on the graphical screen as monitor coverage information together with the rack row icons 45, which allows the user to intuitively recognize the arrangement of the temperature sensors and enables easier and more accurate planning of temperature sensor arrangement.

Further, with the assistance apparatus according to this embodiment, in a case where any rack row icon 45 is moved on the graphical screen or the type of any rack row used is changed, for example, and at least one of the interval data regarding the rack rows adjacent to each other and the dimension data of the rack row of interest is changed accordingly, the monitor area displayed is automatically refreshed, which further increases users' convenience.

Further, with the assistance apparatus according to this embodiment, the monitor area data 145 is generated by using information that is readily available, such as the height h and the length L of the rack rows and the field-of-view angle ϕ of the temperature sensors. Therefore, in a case where the type of rack or the type of temperature sensor used in an existing temperature monitoring system is changed, for example, the dimension data 141 and the field-of-view angle data 142 need to be updated, but it is not necessary to change the algorithm for generating the monitor area data 145. That is, it is possible to flexibly respond to a change in the configuration of an assistance-target temperature monitoring system.

The disclosure made by the present inventors has been specifically described above on the basis of embodiments; however, the disclosure is not limited to such embodiments, and various modifications can be made without departing form the spirit of the disclosure as a matter of course.

The method for generating recommended temperature sensor position data in the case where the rack row 5_1 and the rack row 5_2 adjacent to each other are arranged without a displacement in the Y-axis direction is illustrated in FIG. 15, for example. However, the rack row 5_1 and the rack row 5_2 need to respectively have surfaces that at least partially face each other in the X-axis direction and, for example, the rack row 5_2 may be displaced from the rack row 5_1 in the Y-axis direction by ±Δy (<L). Also in this case, the position of each temperature sensor 6 in the Y-axis direction can be calculated while the end surface 50C of the monitor target rack row 5_1 is assumed to be the reference (y=0), as described above.

The display form used on the graphical screen is not limited to the examples illustrated in, for example, FIGS. 8 to 10. For example, the shape of the rack row icon 45, that of the temperature sensor icon 46, and that of the icon 47, which represents the monitor area 61, are not limited to those illustrated in FIGS. 8 to 10 and can be changed to various shapes. As information about the placement position of each temperature sensor, not only the temperature sensor icon 46 but also information about the coordinates in the three-dimensional space 30, for example, may be displayed on the screen. The method for displaying a selected icon, for example, may be changed. For example, a selected icon may be blinked, or the color of a selected icon may be changed.

As a specific equation used to calculate n, which is the number of necessary temperature sensors 6, equation (3) is presented; however, the equation is not limited to equation (3). For example, a function that returns the largest integer smaller than or equal to p may be used instead of ceil(p). Accordingly, it is possible to meet the needs of users who think that, for example, the surface temperature of part of the surface 50B of one rack row 5 needs to be detected and the surface temperature of the entire surface 50B of one rack row 5 need not be detected.

In the above-described embodiments, the method for displaying the temperature sensor icons 46 in the case of automatically calculating the recommended temperature sensor position data 144 is described (see FIG. 13, for example); however, the temperature sensor position data 144 may be generated by an operation input by the user.

For example, in the case where the temperature sensor icon 46 is arranged in the arrangement area 41 by a user operation, such as a drag-and-drop operation, using a mouse or the like as described above, the temperature sensor position data generation unit 13 may generate the temperature sensor position data 144 on the basis of information about the position in the arrangement area 41, and the display control unit 15 may display monitor coverage information as the icons as illustrated in FIG. 10 on the basis of the temperature sensor position data 144 and the monitor area data 145.

In the above-described embodiments, the case is described where data that indicates the positions of temperature sensors with which the number of temperature sensors necessary for a monitor-target rack row to be included in the monitor area is minimized is generated as the recommended temperature sensor position data; however, the recommended temperature sensor position data is not limited to such data. The recommended temperature sensor position data may be calculated so that the number of temperature sensors is larger than the minimum number by about 10 percent, for example, in order to provide a margin.

In the above-described embodiments, as the method for displaying monitor coverage information, the method in which information indicating the temperature sensors (temperature sensor icons 46) is displayed and the method in which both information indicating the monitor areas 61 (icons 47) and information indicating the temperature sensors (temperature sensor icons 46) are displayed on the screen are presented; however, the method for displaying monitor coverage information is not limited to these methods. Only information indicating the monitor areas 61 (icons 47) may be displayed without displaying information indicating the temperature sensors (temperature sensor icons 46).

The field-of-view width W is calculated as the length of the upper short side of the monitor area, as illustrated in FIG. 5; however, the field-of-view width W may be calculated by using a function W(v) of a specified height v in the Z-axis direction as expressed by equation (4) below and by specifying the height. Here, W1 is the length of the lower long side of the monitor area in a trapezoid shape illustrated in FIG. 5 and is calculated by using equation (5) below as the length of the section BC in FIG. 12.

$$W(v) = \frac{v}{h}W + \left(1 - \frac{v}{h}\right)Wl \quad (4)$$

$$Wl = 2(h \sin \theta r + d \cos \theta r)\tan\frac{\phi}{2} \quad (5)$$

Accordingly, it is possible to meet the needs of users who want to check the monitor area for the specified height.

The angle θr is calculated by using equation (2) as a recommended angle; however, a value specified by the user may be used. Accordingly, it is possible to meet the needs of users who want to widely monitor an upper portion of the rack row without monitoring a lower portion thereof by decreasing the placement angle of the temperature sensor or users who want to simultaneously monitor the temperature of an air outlet, for example, on the floor by increasing the placement angle of the temperature sensor.

Regarding display of monitor coverage information, the surface 50B of a rack row and the monitor area 61 thereon may be displayed in two dimensions, as illustrated in FIG. 5, by using the dimension data of the rack row, the temperature sensor position data, and the field-of-view width W(v), which is a function of the height v in the Z-axis direction. Alternatively, monitor coverage information may be displayed in three dimensions by using information about the perspective view illustrating the configuration of the temperature monitoring system (FIG. 1), the temperature detection area (FIG. 4), and the monitor area (FIG. 5).

What is claimed is:

1. An assistance apparatus for assisting placement of non-contact-type temperature sensors in a temperature monitoring system for monitoring surface temperatures of racks that store ICT devices by using the temperature sensors, the assistance apparatus comprising:
   processing circuitry configured to
      generate monitor area data of the temperature sensors in a three-dimensional space in which the racks are arranged, based on
         dimension data of rack rows that are each constituted by a plurality of racks among the racks and that are arranged in a first direction in the three-dimensional space, the dimension data including a length of each of the rack rows in the first direction and a height of each of the rack rows in a second direction perpendicular to the first direction in the three-dimensional space,
         interval data that includes an interval, in a third direction, between the rack rows that are adjacent to each other in the third direction, the third direction being perpendicular to the first direction and the second direction in the three-dimensional space, field-of-view angle data that includes a field-of-view angle of each of the temperature sensors, and temperature sensor position data that indicates certain temperature sensor positions; and display monitor coverage information on a display device based on the monitor area data, wherein the assistance apparatus further comprises an operation input unit that is used to externally input an operation, and the processing circuitry is further configured to generate the interval data, display rack row images that represent the rack rows on the display device, in accordance with the operation input via the operation input unit, and generate the interval data based on a distance between the rack row images that are displayed on the display device and that are adjacent to each other in the third direction.

2. The assistance apparatus according to claim 1, wherein the processing circuitry is further configured to generate, based on the dimension data, the interval data, and the monitor area data, recommended temperature sensor position data that indicates a temperature sensor placement position with which a monitor-target rack row among the rack rows is included in a monitor area, and display a temperature sensor image that represents the temperature sensor placement position on the display device as monitor coverage information together with the rack row images.

3. The assistance apparatus according to claim 1, wherein the processing circuitry is further configured to update, in a case where the interval data is changed, the monitor area data based on the changed interval data, and refresh display of the monitor coverage information when the monitor area data is updated.

4. The assistance apparatus according to claim 2, wherein the processing circuitry is further configured to update, in a case where the interval data is changed, the monitor area data based on the changed interval data, and refresh display of the monitor coverage information when the monitor area data is updated.

5. The assistance apparatus according to any one of claim 1, wherein the processing circuitry is further configured to update, in a case where the dimension data is changed, the monitor area data based on the changed dimension data, and refresh display of the monitor coverage information when the monitor area data is updated.

6. The assistance apparatus according to claim 2, wherein the processing circuitry is further configured to generate the temperature sensor position data by calculating a field-of-view width based on the height of a monitor-target rack row among the rack rows, the interval, and the field-of-view angle, and by calculating the number of the temperature sensors that are necessary to monitor a surface temperature of the monitor-target rack row, and calculating positions of the necessary temperature sensors in the first direction relative to the monitor-target rack row based on the field-of-view width and the length of the monitor-target rack row.

7. An assistance method for using a computer to assist placement of non-contact-type temperature sensors in a temperature monitoring system for monitoring surface temperatures of racks that store ICT devices by using the temperature sensors, the assistance method comprising:

generating, by the computer, monitor area data of the temperature sensors in a three-dimensional space in which the racks are arranged, based on dimension data of rack rows that are each constituted by a plurality of racks among the racks and that are arranged in a first direction in the three-dimensional space, the dimension data including a length of each of the rack rows in the first direction and a height of each of the rack rows in a second direction perpendicular to the first direction in the three-dimensional space, interval data that includes an interval, in a third direction, between the rack rows that are adjacent to each other in the third direction, the third direction being perpendicular to the first direction and the second direction in the three-dimensional space, field-of-view angle data that includes a field-of-view angle of each of the temperature sensors, and temperature sensor position data that indicates certain temperature sensor positions; and displaying, by the computer, monitor coverage information on a display device based on the generated monitor area data, wherein the method further includes generating the interval data, displaying rack row images that represent the rack rows on the display device, in accordance with an operation input via an operation input unit, and generating the interval data based on a distance between the rack row images that are displayed on the display device and that are adjacent to each other in the third direction.

8. A non-transitory recording medium storing a program for causing a computer to perform the steps in the method according to claim 7.

9. The method of claim 7, further comprising:

generating recommended temperature sensor position data that indicates temperature sensor placement positions of the temperature sensors; and arranging the temperature sensors at the temperature sensor placement positions.

10. An assistance apparatus for assisting placement of non-contact-type temperature sensors in a temperature monitoring system for monitoring surface temperatures of racks that store ICT devices by using the temperature sensors, the assistance apparatus comprising:

processing circuitry configured to generate monitor area data of the temperature sensors in a three-dimensional space in which the racks are arranged, based on dimension data of rack rows that are each constituted by a particular plurality of racks among the racks and that are arranged in a first direction in the three-dimensional space, the dimension data including a length of each of the rack rows in the first direction and a height of each of the rack rows in a second direction perpendicular to the first direction in the three-dimensional space, interval data that includes an interval, in a third direction, between the rack rows that are adjacent to each other in the third direction, the third direction being perpendicular to the first direction and the second direction in the three-dimensional space, field-of-view angle data that includes a field-of-view angle of each of the temperature sensors, and temperature sensor position data that indicates certain temperature sensor positions; and display monitor coverage information on a display device based on the monitor area data, wherein the processing circuitry is further configured to generate, based on the dimension data, the interval data, and the monitor area data, recommended temperature sensor position data that indicates a temperature sensor placement position with which a monitor-target rack row among the rack rows is included in a monitor area, and display a temperature sensor image that represents the temperature sensor placement position on the display device as monitor coverage information together with the rack row images.

\* \* \* \* \*